April 29, 1958 E. P. THIAS 2,832,890

COMBINATION FREQUENCY SELECTOR

Filed Dec. 28, 1953 5 Sheets-Sheet 1

INVENTOR.
EDWIN P. THIAS

BY

Ostrolenk & Faber
ATTORNEYS

COMBINATION FREQUENCY SELECTOR

Filed Dec. 28, 1953 5 Sheets-Sheet 2

INVENTOR.
EDWIN P. THIAS

BY

Ostrolenk & Faber
ATTORNEYS

April 29, 1958 E. P. THIAS 2,832,890

COMBINATION FREQUENCY SELECTOR

Filed Dec. 28, 1953 5 Sheets-Sheet 3

INVENTOR.
EDWIN P. THIAS

BY

Ostrolenk & Faber
ATTORNEYS

INVENTOR.
EDWIN P. THIAS

BY

Ostrolenk & Faber
ATTORNEYS

INVENTOR.
EDWIN P. THIAS
BY
Ostrolenk & Faber
ATTORNEYS

1

2,832,890

COMBINATION FREQUENCY SELECTOR

Edwin P. Thias, Los Angeles, Calif., assignor to Standard Coil Products Co., Inc., Los Angeles, Calif., a corporation of Illinois Application December 28, 1953, Serial No. 400,734

2 Claims. (Cl. 250—40)

My present invention relates to television tuners and more particularly it relates to discrete type tuners operable in the V. H. F. and U. H. F. ranges.

In co-pending application Serial No. 325,514, filed December 12, 1952, now Patent No. 2,773,986, dated December 11, 1956, a discrete type tuner was disclosed comprising two turrets mounted on concentric shafts of which one selected U. H. F. channels, the other V. H. F. channels. A switch was provided so that during U. H. F. reception the V. H. F. section of the tuner would be disconnected from the V. H. F. tuning elements connected to another group of tuning elements and would perform as an amplifier. When a V. H. F. channel was desired, this switch provided a connection between the tuning elements of the V. H. F. section and stationary mounted elements of the V. H. F. section.

In order to select a channel within a given band, U. H. F. or V. H. F., it was first necessary to switch in the desired band and then by operation of a second control the individual channel within that band was selected. In addition, fine tuning means were provided in both the U. H. F. and V. H. F. sections to fine tune after discrete selection of the desired channel.

In other words, the switch contacts must be capable of providing good electrical connections at two different points, one point corresponding to the connection with the V. H. F. turret, the other point corresponding to the connection with the auxiliary circuit.

The contact used in the present invention is essentially a long flat spring member channeled in the longitudinal direction and appropriately preloaded so as to maintain even contact pressure regardless of the free position of the contact member itself. The longitudinal channeling on the flat spring is provided so as to make the spring member fairly stiff but is not done through the whole length of each contact but only up to a predetermined length so that the rest of the contact is quite resilient. Because of this construction and the length of the contact members, it is found that considerably less fatigue of the spring member and less resistance to tuning of the turret is encountered by using this particular shape for the contact members.

The position of the previously mentioned switch was determined by the U. H. F. turret so that in one position of the U. H. F. turret the switch would take a certain position while in all the other positions of the U. H. F. turret, the switch would take a second position.

The control mechanism of the switch mechanism consists in the present invention of a cam surface forming an integral part with the U. H. F. turret engaging a cam follower having a shaft position so that it can operate the switch to either of its two positions. The cam follower and the shaft are appropriately biased against the cam surface, and the cam surface in this particular embodiment has a number of similar notches and two dissimilar notches. One of the dissimilar notches causes the cam follower and, therefore, the switch structure to take the position corresponding to V. H. F. reception under all conditions. The other dissimilar notch through operation of a sliding member may cause the cam follower and therefore the switch structure to take the position for either V. H. F. or U. H. F. reception.

2

It may be necessary at this point to recall the fact that there are 12 V. H. F. channels numbered 2 to 13, inclusive, in addition to the U. H. F. channels 14 to 84. The 12 V. H. F. channels occupy a frequency range extending from 54 megacycles (channel 2) to 216 megacycles (channel 13). The U. H. F. channels instead occupy a frequency range from 470 to 890 megacycles.

If then (1) a desired system of tuning is used, that is one in which the television frequency range is divided in bands of 10 channels each, for example, band 3 comprises channels 30–39, and (2) if the U. H. F. and V. H. F. tuning means are different and separate but the same channel positioning means are used for both V. H. F. and U. H. F. channels, and (3) in view of the fact that there are 12 V. H. F. channels, the cam mechanism for operating this switch must be such that it will be possible to tune from V. H. F. channel 13 to U. H. F. channel 14 by continuous rotation of one member without having to operate other control means for selection of the U. H. F. or V. H. F. ranges.

This is obtained in the present invention and disclosed in co-pending application, Serial No. 392,950, filed November 18, 1953 by the use of the cam surface which provides under certain operating conditions a number of positions for its cam follower and which under other operating conditions provides other positions either previously non-existent or similar to the above mentioned ones.

Specifically, in this invention the cam mechanism consists of a cam surface provided, as previously mentioned, in view of the application of this cam to this particular U. H. F.–V. H. F. tuner, with a number of notches, equal in depth, and two notches extending more deeply toward the center of rotation of the cam surface. Actually, a cam surface having essentially two diameters would suffice for the switching operation since one would take care of U. H. F. operation and the other of V. H. F. operation.

Individual notches for the U. H. F. positions permit as described hereinafter a cleaning action of the switch contacts.

The cam surface is mounted on the U. H. F. turret and one of the U. H. F. notches is made slidable so that its position is determined by the angular position of another cam surface, in this case a circular sector, positioned in the interior of the first cam surface and having as its follower the slidable notch. The second cam surface establishes only two positions to the slidable notch member.

The operation of this cam, when applied to the present V. H. F.–U. H. F. tuner, is the following: channels 2–13 are obtained by setting the U. H. F. turret in the V. H. F. reception position, and the V. H. F. turret is then rotated for selection of these V. H. F. channels. In this case the U. H. F. turret is inoperative and the switch contacts engage the V. H. F. turret.

A problem arises when the decade type of dialing is used, that is when a dial system is used in which after the ninth unit digit a new digit appears in the tens place. This system is from the operator's point of view the simplest since the operator is generally accustomed to this type of rotation and dialing.

The problem is essentially this: There are 12 V. H. F. channels numbered from 2 to 13 which require V. H. F. tuning elements, and there are also 70 U. H. F. channels numbered from 14 on which require U. H. F. tuning elements. This means that part of the channels between channels 10 and 19 are at V. H. F., part at U. H. F., and that, accordingly, if one uses V. H. F. tuning elements one can only go up to channel 13 and no further, and if one uses U. H. F. tuning elements he can go only down to channel 14 and no lower. This necessitates the use of individual tuning elements, one for V. H. F. channels 10 to 13, the other for U. H. F. channels 14 to 19 with a switch to disconnect the V. H. F. elements and connect the U. H. F. elements when the operator turns the dial from 13 to 14, and increases when the dial is turned from 14 to 13.

While this switching operation occurs within the tuner, the dial must provide an indication of whether the operator is now tuning in the U. H. F. or V. H. F. region.

In other words, due to the decade system used in U. H. F., channels numbered 10–13 would appear in the dial once as V. H. F. and once as U. H. F. channels. This problem is overcome by my present cam mechanism as follows:

Considering first for example the tuning procedure to be followed to tune in channel 10, the U. H. F. turret is tuned by one step so that the slidable notch is engaged by the switch operating cam follower. This would cause operation of the switch contacts from engagement of the V. H. F. turret to engagement of an auxiliary assembly which, as described hereinafter, serves to transform the U. H. F. section of the present tuner into an I. F. amplifier. But since the V. H. F. turret has now been moved from position 9 to position 0, the second cam surface movable with the V. H. F. turret does not engage the slidable notch which, therefore, under the pressure of the switch control cam follower will occupy a lower position similar in depth to the V. H. F. notch so that the switch remains in the V. H. F. turret engagement position.

When the V. H. F. turret is tuned from V. H. F. channel 13 to U. H. F. channel 14, the circular sector engages the slidable notch and moves it to its outer position so that it is undistinguishable from the other U. H. F. notches. Now the switch is operated and its contacts correspondingly move from engagement with the V. H. F. turret to engagement with the auxiliary assembly to transform the V. H. F. section into an I. F. amplifier.

From channel 14 on the switch will retain this position.

If, on the other hand, only V. H. F. channels are desired, the operator when going from channel 9 to 10 need not move the U. H. F. turret to its position 1, but continues to rotate the V. H. F. turret up to channel 13. From channel 13 the operator may return the turret to channel 2 or by rotating the U. H. F. turret to its position 1 and the V. H. F. turret to the position corresponding to U. H. F. channel 14 he can tune to channel 14 and to all other U. H. F. channels.

It was mentioned that the cam surface instead of being flat for all the U. H. F. positions and having a different configuration for the V. H. F. position is provided with individual notches for each of the U. H. F. positions so that when the U. H. F. turret is rotated during U. H. F. reception the switch assembly is made to wipe the contacts at each step of the U. H. F. turret to maintain the contacts as clean as possible.

During V. H. F. reception as the V. H. F. turret is rotated, the detent positioning disc at the center of the V. H. F. turret is made to engage also a roller positioned on the switch assembly so that at each step of the V. H. F. turret the switch structure is again caused to move and to wipe its contacts.

Another object of the present invention is, therefore, the provision of means for wiping the switch contacts during both U. H. F. and V. H. F. selection.

The foregoing and other objects of the invention will become apparent in the following description and drawings in which:

Figure 1 is a circuit diagram of the tuner of the present invention.

Figure 2 is an exploded view of the tuner of the present invention showing the chassis of the tuner and the elements mounted on the chassis and the V. H. F.–U. H. F. turrets.

Figure 2*a* is a side view of the tuner of the present invention showing the positioning means and the fine tuning mechanism.

Figure 3 is a view taken at line 3—3 of Figure 2 looking in the direction of the arrows and showing the cam mechanism during V. H. F. reception of channels 10–13.

Figure 4 is a view similar to that of Figure 3 showing the cam mechanism during U. H. F. reception of channels 14–19.

Figure 5 is a cross-sectional view taken at line 5—5 of Figure 2 looking in the direction of the arrows.

Figure 6 is a side view of the stationary contacts of the V. H. F. turret.

Figure 9:
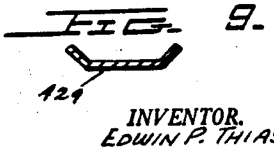
Figure 9 is a cross-sectional view taken at line 9—9 of Figure 6 looking in the direction of the arrows.
Figure 7:
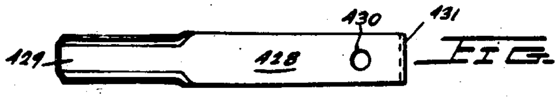
Figure 7 is a top view of the contacts of Figure 6.
Figure 9A:
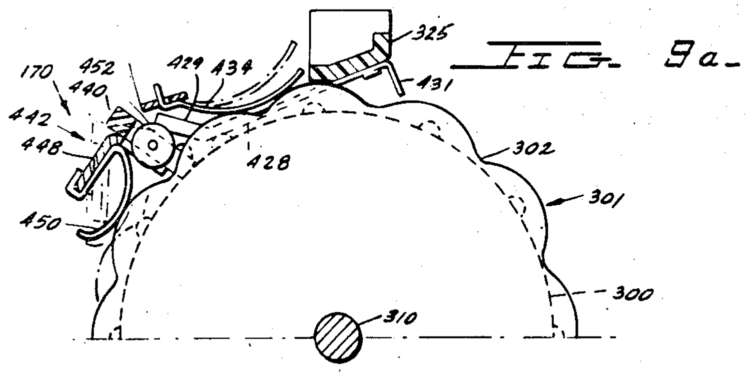

Figure 9*a* is a cross-sectional view of the V. H. F. turret at the positioning disc showing the position of the wiping control roller when the V. H. F. turret is set for reception of a V. H. F. channel.

Figure 9B:
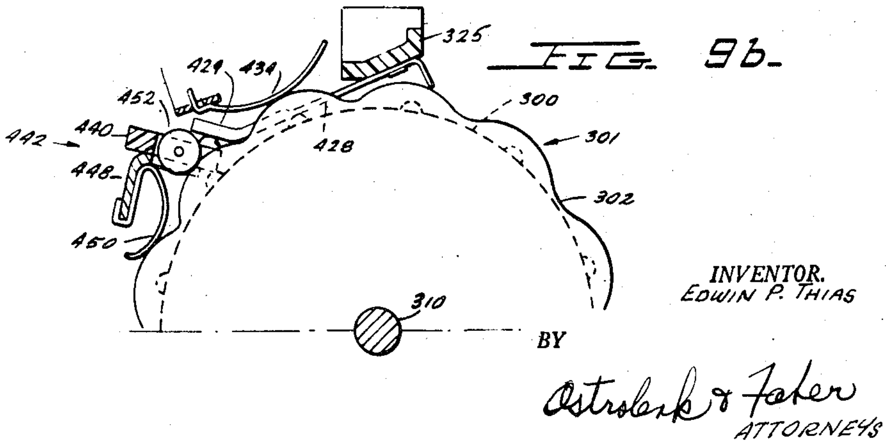

Figure 9*b* is a view similar to that of Figure 9*a* showing the position of the roller, the auxiliary assembly and the switch contacts when the V. H. F. turret is in an intermediate position between two channels.

Figures 10, 11:
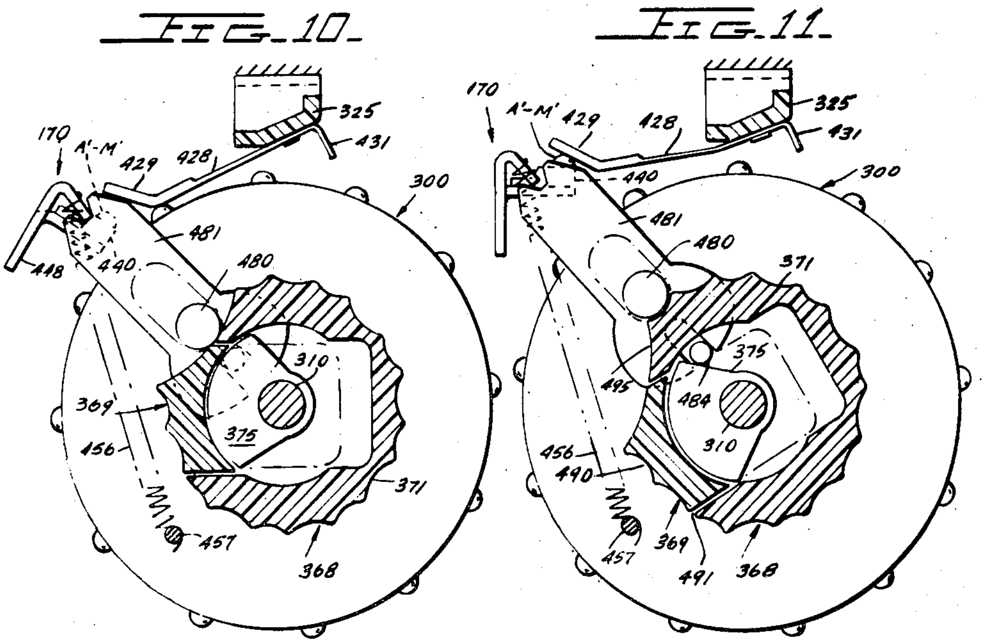

Figure 10 is a view of a cam mechanism of the present invention showing the position of the cam members during V. H. F. reception.

Figure 11 is a view of the cam mechanism similar to that of Figure 10 showing the cam members during U. H. F. reception.

Figure 1:
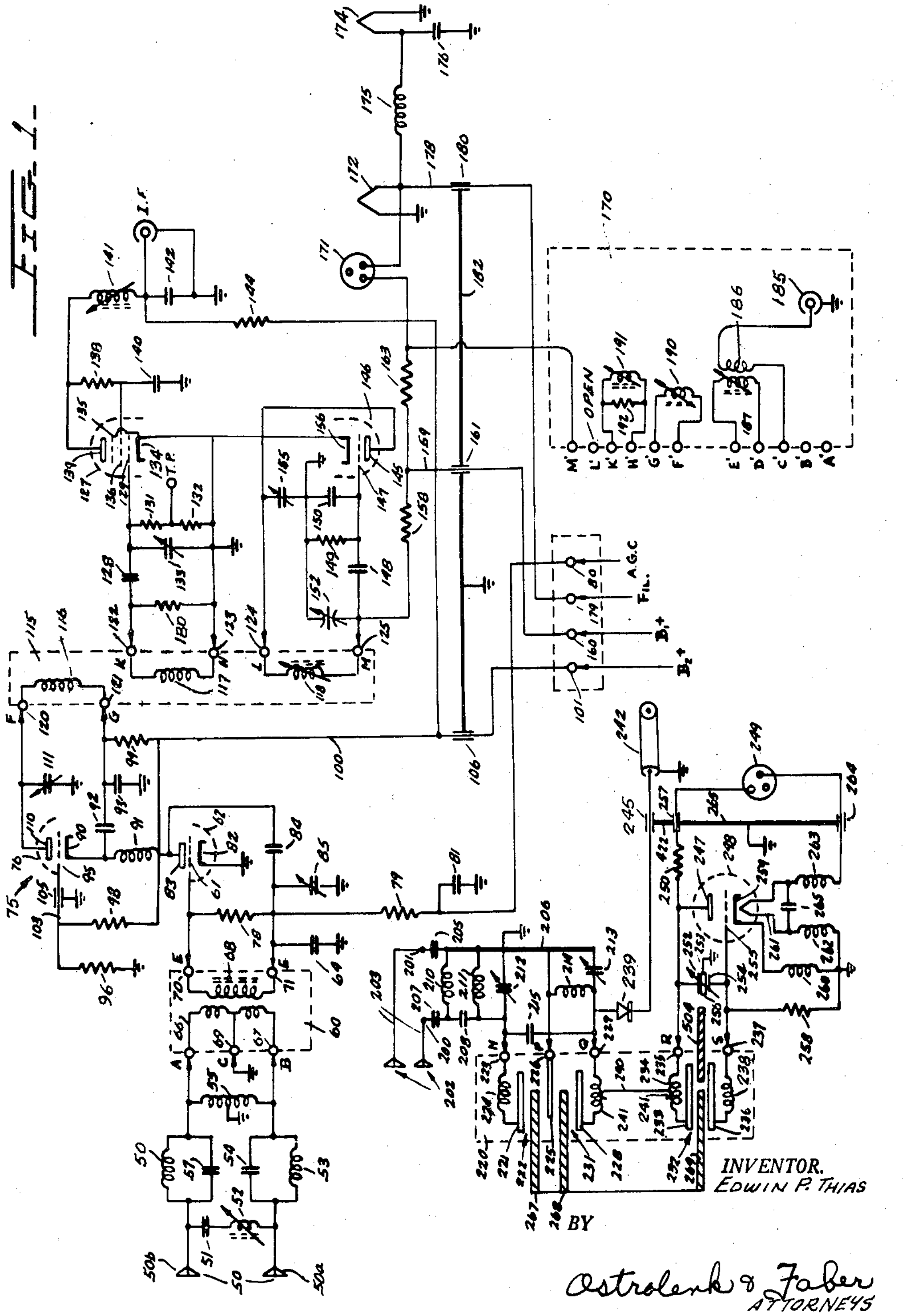

Referring first to Figure 1 showing the schematic circuit diagram of the present U. H. F.–V. H. F. tuner, the V. H. F. antenna 50 which is shown here as a balanced antenna is connected to a series circuit consisting of a capacitance 51 and a variable inductance 52. Variable inductance 52 may consist of a coil with a conductive slug within it so that displacement of the slug with respect to the coil produces the desired variation in inductance. Across the balanced output of this coil assembly is placed a balanced center tapped coil (iron core) 55.

To be more specific, section **50*a* of V. H. F. antenna 50 is connected to the free end of inductance 52 while the other side, 50*b*, of antenna 50 is connected to the free end of capacitor 51**.

Antenna section **50*a* is also connected to a parallel circuit consisting of an inductance 53 and a capacitance 54. The other side of the parallel circuit 53—54 is connected to a fixed terminal B. Similarly, section 50*b* of antenna 50 is connected to the parallel circuit consisting of inductance 56 and capacitance 57**. This parallel circuit is connected on the other side to a stationary contact A.

It should be noted that aside from the antenna 50 and the transmission line from the antenna to the series circuit 51—52, the other components described above are fixedly mounted on the chassis of the tuner as shown hereinafter in connection with Figure 2.

When the tuner is set for V. H. F. reception, that is, for reception on an individual V. H. F. channel, an antenna segment 60 mounted on the V. H. F. turret also described hereinafter is connected to the fixed terminals A and B and the other fixed terminals C, D, E on the input side of the V. H. F. tuner.

Contact C is a fixed contact connected to ground.

Contact E is connected to the grid 61 of grounded cathode triode 62. Contact D is connected to ground through by-passing capacitor 64.

Mounted on panel 60 is an input transformer having its primary side 65 balanced to ground through connection of its two ends to stationary contacts A and B respectively by means of appropriate movable contacts 66 and 67 mounted on panel 60.

Primary coil 65 is center tapped and the center tap is connected to a movable contact 69 which in turn engages contact C, thus grounding the center tap of coil 65. Also mounted on panel 60 is a secondary 68 of transformer 65—68. Secondary 68 has its terminals connected to movable contacts 70 and 71, which engage the stationary contacts E and D respectively.

It will now be apparent that the transformer 65—68 mounted on panel 60 serves not only as an input coupling device, but also as a means for transforming a balanced input signal into an unbalanced signal. The unbalanced signal which appears across stationary contacts E and D is supplied to the grid 61 of grounded cathode triode 62 of R. F. amplifier 75. R. F. amplifier 75 consists of two triodes 62 and 76 connected in cascode.

To be more specific, stationary contact E is connected not only to grid 61 of tube 62, but also through a series circuit consisting of resistances 78 and 79 to a terminal 80 to which, as noted in Figure 1, an A. G. C. voltage may be applied as a bias.

A capacitance 81 connected between resistance 79 and contact 80 serves to by-pass to ground A. C. signals which would otherwise cause fluctuations and therefore distortion in the output of triode 62. Cathode 82 of triode 62, as previously mentioned, is grounded while plate 83 of tube 62 is connected on one side to a series capacitance 84 and to contact D.

In parallel to the previously mentioned capacitance 64 is also a trimmer capacitor 85. On the other side, plate 83 of tube 62 is connected to cathode 90 of grounded grid triode 76 through a series inductance 91. Cathode 90 is connected to ground through capacitance 92 in series with a second capacitance 93. Grid 95 of triode 76 is grounded through resistance 96 connected between grid 95 and ground and is connected to the common point between capacitances 92 and 93 through series resistances 98 and 99. The common point between resistances 98 and 99 is connected through conductor 100 to a stationary contact 101 to which, during operation of the tuner, a $B+_2$ supply is connected.

To ensure proper operation of the R. F. amplifier, lead 103 between resistance 96 in grid 95 is by-passed to ground by means of a feed-through capacitor 105 and lead 100 is by-passed to ground through a feed-through capacitor 106.

Finally, plate 110 of triode 76 is connected to a trimmer capacitor 111 connected between plate 110 and ground and to a stationary contact F. The common point between capacitances 92 and 93 and resistance 99 is connected to another stationary contact G.

During operation of the tuner, a second panel 115 is connected to stationary contacts FG, KH, LM. Mounted on panel 115 are three tuning elements, in this case, three inductances 116, 117, and 118. Inductance 116 terminates at the panel mounted contacts 120 and 121, which engage respectively stationary contacts F and G. Inductance 117 terminates at panel mounted contacts 122 and 123 which engage stationary contacts K and H. Finally, inductance 118 terminates at movable contacts 124, 125 which engage stationary contacts L and M respectively.

While inductance 116 and inductance 117 are fixed inductances, inductance 118 is variable and generally of a slug tuned type. Since inductances 116, 117 and 118 are mounted in the same panel 115 and are not shielded from each other, there will be mutual coupling between the three inductances so that a signal appearing, for example, across inductance 116 would be coupled to inductance 117, and a signal appearing across inductance 118 would also be coupled to inductance 117.

Inductance 117 which is connected to stationary contacts K and H, is in the input of converter tube, in this case a pentode 127, through a coupling capacitor 128 connected between contact K and grid 129 of pentode 127. Contact K is connected to ground through resistance 130 and grid 129 is connected to ground through the series combination of resistances 131 and 132. A terminal is brought out from the common point of resistances 131 and 132 to permit testing of the tuner and is therefore designated as T. P. in Figure 1.

Across the resistance combination 131 and 132 is connected a trimmer capacitor 133. Cathode 134 of converter 127 is connected to ground and to suppressor grid 135. Screen grid 136 of tube 127 is connected through a dropping resistance 138 to plate 139 of tube 127 and is bypassed to ground by capacitor 140 connected between screen grid 136 and ground.

The output from converter tube 127 is obtained through a circuit consisting of a variable inductance 141 and a capacitance 142 connected in series between plate 139 of tube 127 and ground. The I. F. output of the present tuner is actually obtained from across capacitor 142 and is brought out to a receptacle mounted on the chassis of the tuner. The common point between elements 141 and 142 is connected to lead 100 and therefore to the $B+_2$ supply through a dropping resistance 144.

Oscillator coil 118 is connected on one side through contact L to plate 145 of oscillator triode 146. The other side of inductance 118 is connected to the grid 147 of tube 146 through a coupling capacitor 148 and a grid leak resistance 149. Capacitor 148 is connected between contact M and grid 147 while grid leak resistor 149 is connected between ground and grid 147.

Also connected between ground and grid 147 is capacitor 150. While a fine tuning capacitor 152 is connected between stationary contact M and ground, another timmer capacitor 155 connects contact L to ground. Also connected to ground is cathode 156 of oscillator tube 146. Contact M is connected to the $B+_1$ supply through a resistor 158, lead 159, terminal 160. Lead 159 is properly by-passed to ground by means of feed through capacitor 61.

Also connected to lead 159 is a resistance 163 connected on the other side to a contact M' of the auxiliary assembly 170. Resistor 163 is also connected to a receptacle 171 mounted on the chassis of the present tuner. To another contact of the same receptacle is connected one side of filament 172 for the double triode tube 62—76. The other side of filament 172 is grounded. The ungrounded side of filament 172 is connected to filament 174 of tube 127—146 through a R. F. choke 175. Filament 174 is thus connected on one side to choke 175 and on the other side to ground.

A capacitance 176 is also connected to the ungrounded side of filament 174 to by-pass high frequencies. The common point between filament 172 and choke 175 is connected to a lead 178 which terminates at a contact 179 to which, during the operation of the tuner, a filament supply would be supplied. Lead 178 is also by-passed to ground through a feed through capacitor 180.

It should be apparent later, when describing the actual configuration of the V. H. F. tuner, that feed through capacitors 106, 161 and 180 are mounted through a shield 182 which is shown schematically in Figure 1.

It is now possible to describe the operation of this V. H. F. section of the present tuner. When, for example, channel 2 is desired, then the appropriate channel boards 60 and 115 are connected to the stationary contacts A, B, C, D, E, F, G, H, K, L, and M so that the elements mounted on panels 60 and 115 are those which correspond to the frequencies of channel 2 (54–60 mc.).

The signal of the correct frequency which appears on antenna 50 mixed with other undesired signals is selected by the input circuit of the R. F. amplifier 75. It will appear properly amplified at the output of this amplifier, namely across inductance 116.

At the same time, oscillator tube 146 produces signals of the correct frequency across inductance 118. The input signals and the oscillator signals are coupled into the input inductance 117 of converter tube 127 and mixed at converter 127 in a manner well known in the art so that across capacitance 142 will appear the desired signal at the desired I. F., at either 21 mc. or at 41 mc. depending on which I. F. is used in the television receiver itself.

In addition to contact M′, also contacts A′, B′, C′, D′, E′, F′, G′, H′, K′, and L′ are mounted on auxiliary assembly 170. The function of the circuits mounted on this auxiliary assembly 170 will be apparent hereinafter when the U. H. F. operation of the present tuner will be described.

Contacts A′ and B′ of assembly 70 are open and contact C′ is connected to the female of an I. F. coaxial connector 185 through a coil 186. Across contacts E′ and D′ is a coil 187 having a variable inductance.

Coils 186 and 187 form an I. F. transformer of which coil 186 is a primary and 187 is a tunable secondary. Connected across contact G′ and F′ is also a variable inductance 190 and across contacts H′ and K′ is connected a parallel circuit consisting of a variable inductance 191 in parallel with resistance 192. Contact L′ is left open and contact M′ as previously mentioned is connected to resistance 163.

The U. H. F. section of the present tuner consists of antenna terminals 200 and 201 mounted externally on the chassis of the present tuner. For proper operation of the present tuner, a U. H. F. antenna 202 balanced with respect to ground, is connected to terminals 200 and 201 through a balanced transmission line 203. Connected to terminal 201 is a capacitance 205 having the other side connected to a grounding plate 206. Terminal 200 is connected to a capacitance 207 in series with another capacitance 208 terminated at stationary contact N. Connected between the common point between capacitances 207 and 208 and ground is an inductance 210 and connected between stationary contact N and ground is an inductance 211. In parallel with the inductance 211 is a trimmer capacitance 212.

All the elements in the input to the U. H. F. tuner described up to now form a filtering circuit to essentially pass only U. H. F. signals and discriminate against V. H. F. signals. Another stationary contact P is connected to grounding member 206 and in alignment with contacts N and P is a third contact Q connected to ground through trimmer capacitor 213. Connected across contacts P and Q is an inductance 214 and connected across N and Q is a R. F. coupling capacitor 215 providing a constant band width for all the U. H. F. bands.

When the present tuner is operated as a U. H. F. tuner, a panel 220 is connected to contacts N, L, Q, R, S. Panel 220 carries tuning elements and more precisely it carries a plate 221 of a capacitor 222 where plate 221 is connected to a movable contact 223 through a coil 224. The other plate 225 of capacitor 222 is connected to contact 226.

Another plate 228 is connected to contact 229 through coil 230. Plate 228 forms with previously mentioned plate 225 a second capacitor 231. Also mounted on panel 220 is a third capacitor 232 having one of its plates 233 connected to a coil 234 and thence to a contact 235. The second plate 236 of capacitor 232 is connected to contact 237 through coil 238.

A lead 240 having probes 241 at its two ends serves as the injecting device between coil 234 and coil 230 for injecting an oscillator signal into a crystal mixer as described hereinafter.

During operation of the U. H. F. tuner, plate 221 is connected through coil 224, contacts 223 and N, to the input filter of the U. H. F. tuner. Plate 225 is connected to ground through contacts 226, P and plate 228 is connected to crystal mixer 239 through coil 230, contacts 229 and Q.

One side of crystal 239 is connected to an extension of the ungrounded plate of capacitor 213. The other side of crystal 239 is connected to coaxial cable 242 through feed-through capacitor 245. Feed-through capacitor 245 is provided at the crystal end with a receiving member cup-shaped for receiving one terminal 243 of crystal 239. Plate 233 of capacitor 232 is connected to the stationary contact R through coil 234 and movable contact 235 while plate 236 is connected to contact S through coil 238 and movable contact 277. Stationary contact R is connected to plate 247 of U. H. F. oscillator tube 248. Plate 247 is connected to power plug 249 through dropping resistance 250 and feed-through capacitor 251. Plate 247 is also connected to plate 252 of a capacitor assembly 253 which has its other plate 254 connected to contact S and grid 255 of tube 248 and a center conductive member 256 connected to ground and movable with respect to plates 252 and 254 to vary the capacitance between plates 252 and 254 and conductive element 256.

Grid 255 is connected to ground through a grid leak resistor 258 while cathode 259 of tube 248 is connected to ground through coil 260.

Filament 261 of tube 248 is connected on one side to coil 262 and thence to ground and on the other side to coil 263, feed through capacitor 264 and one contact of power plug 249. Connected across filament 261 is also a capacitor 265. Feed through capacitors 251 and 264 are mounted through a grounded shield shown in Figure 1 at 265 while feed through capacitor 245 is mounted through a vertical wall of bracket 422.

Panel 220 is mounted together with similar panels to form a U. H. F. turret. This turret is operated by a shaft or a sleeve depending on mechanical details and concentric with this shaft or sleeve, as will be seen hereinafter, is another controlling member carrying a series of dielectric plates, namely plates 267, 268 and 269, where plate 267 serves to vary the capacitance of capacitor 222, plate 268 varies the capacitance of capacitor 231, and plate 269 varies the capacitance of capacitor 232.

In addition, a third controlling member serves to move another dielectric plate 270—270 to vary by small amounts the capacitance of capacitor 232.

It should be noted that in the present invention, each panel 220 is used to pass and select a U. H. F. range encompassing ten U. H. F. channels.

It is now possible to describe the operation of the U. H. F. section of the present tuner. U. H. F. signals picked up by antenna 202 pass through the input filter described above and a particular U. H. F. channel is selected through the appropriate panel 220 and the appropriate positioning of plates 267 and 268.

This incoming U. H. F. signal is then applied to the input of crystal mixer 239. At the same time, dielectric plates 269 and 270 may be properly positioned with respect to plates 233 and 236 of capacitor 232 so as to cause oscillator 248 to generate the desired frequency signal. This signal is injected by means of injection device 240 into coil 230 and thence again into the input of crystal mixer 239.

When the frequency of oscillation of oscillator 248 and the frequency of the U. H. F. signal mix in crystal mixer 239, an output is obtained having the desired intermediate frequency of 21 or 45 mc. depending on the intermediate frequency of the television set itself. In the present invention, during U. H. F. reception, the cascode amplifier 75 and the converter 127 of the V. H. F. section are utilized as intermediate frequency amplifiers while the V. H. F. oscillator is made inoperative.

During U. H. F. reception, in fact contacts A–B–C–D–E–F–G–H–K–L–M are disconnected by means of a switching device described hereinafter in connection with Figures 3 and 4 from the contacts mounted on the V. H. F. turret and are caused to engage contacts A′–B′–C′–D′–E′–F′–G′–H′–K′–L′–M′ respectively of assembly 170. When this connection is made, as can be clearly seen in Figure 1, contacts A and B will be shorted and connected to ground. Contact C will be connected to coil 186 through the complementary contact C′ and since a co-axial cable 242 engaged the co-axial connection 185, the I. F. signal from crystal mixer 239 will appear across coil 186.

Across contacts E and D is now connected coil 187 through complementary contacts E′ and D′. Coil 187 being mutually coupled to coil 186 will have across the terminal, E′ and D′ and therefore across its contacts E and D, the I. F. signal which is then applied to cascode amplifier 75 now operating as an I. F. amplifier, that is a fixed frequency amplifier. The output of cascode amplifier 75 appears across a coil 190 through engagement of its terminals F′ and G′ with stationary contacts F and G.

The signal across the inductive load 190 is applied through series network 193—194 to the input circuit 191—192 having its terminals H′ and K′ now connected to contacts H and K of the input of tube 127. Tube 127 now operates as another I. F. amplifier so that across capacitor 142 will now appear an I. F. signal containing the information existing in the original U. H. F. signal.

The signal appearing across capacitor 142 has now been considerably amplified by the cascode amplifier 75 and amplifier tube 127.

Since now no circuit element is connected between contacts L and M and contact M is connected to contact M′ to short circuit resistances 158 and 163, oscillator tube 146 is made for all practical purposes inoperative so that it cannot produce interference or noise signals. Resistance 163 serves to keep alive the voltage to the U. H. F. oscillator tube 248 when the tuner is in V. H. F. position.

It should be noted that whether operating as a V. H. F. or U. H. F. tuner plug 249 and receptacle 171 are always properly connected together by means of conductors (not shown) in a manner well known in the art.

Figure 2:
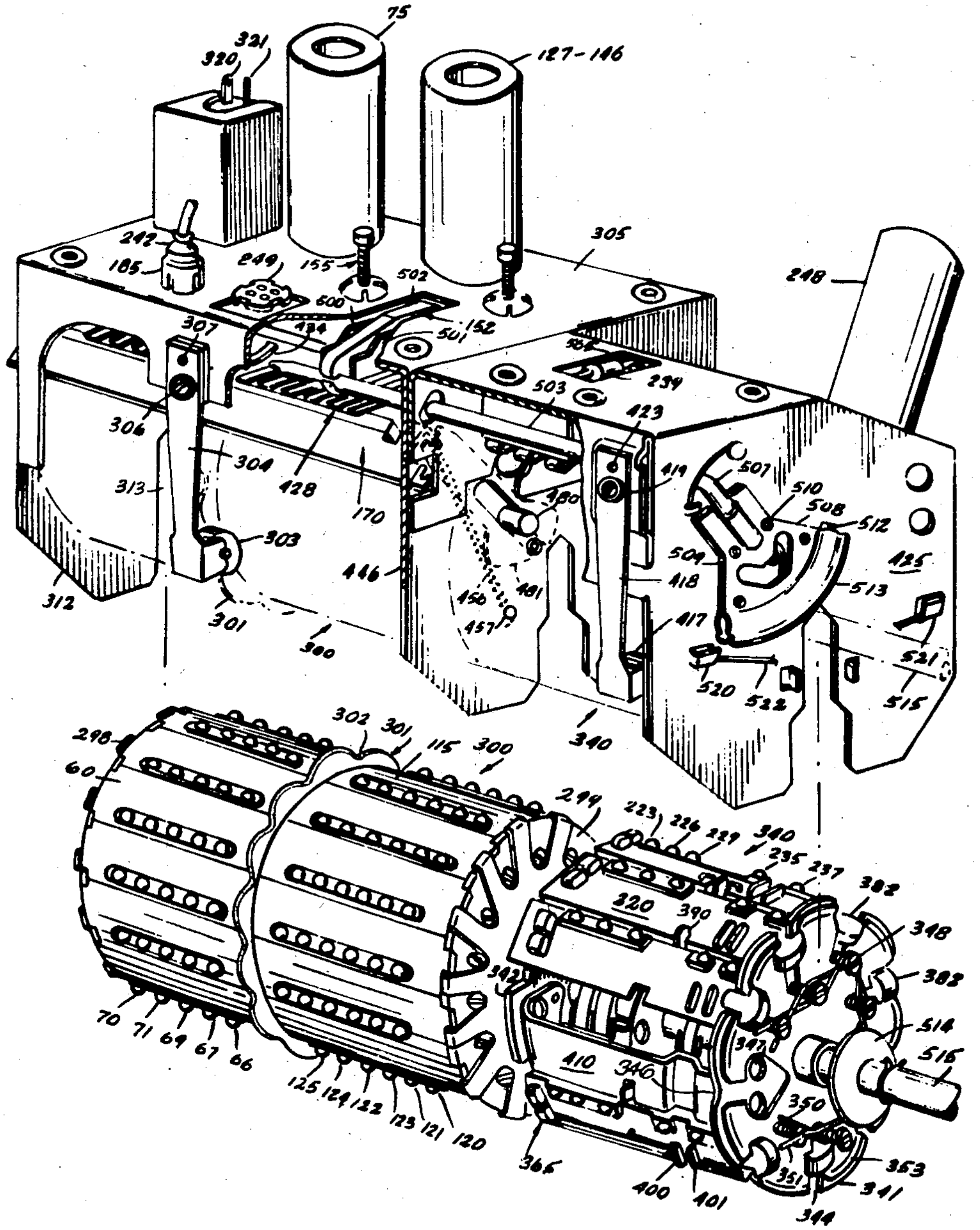

A side cut away view of the tuner of the present invention is shown in Figure 2. The V. H. F. turret 300 is seen to consist of antenna segments 60 and oscillator segments or panels 115. The panels are mounted form turret 300 on three supporting discs: 298, 299 and 301. The two lateral ones 298 and 299 and the center one 301 are provided with appropriate notches such as 302 engageable by roller 303 carried by a spring member 304 secured to the metallic chassis 305 and extending through an opening 308 of member 304. For greater details on the construction of the V. H. F. turret reference is made to Patent No. 2,496,183 to Thias.

Figure 2A:
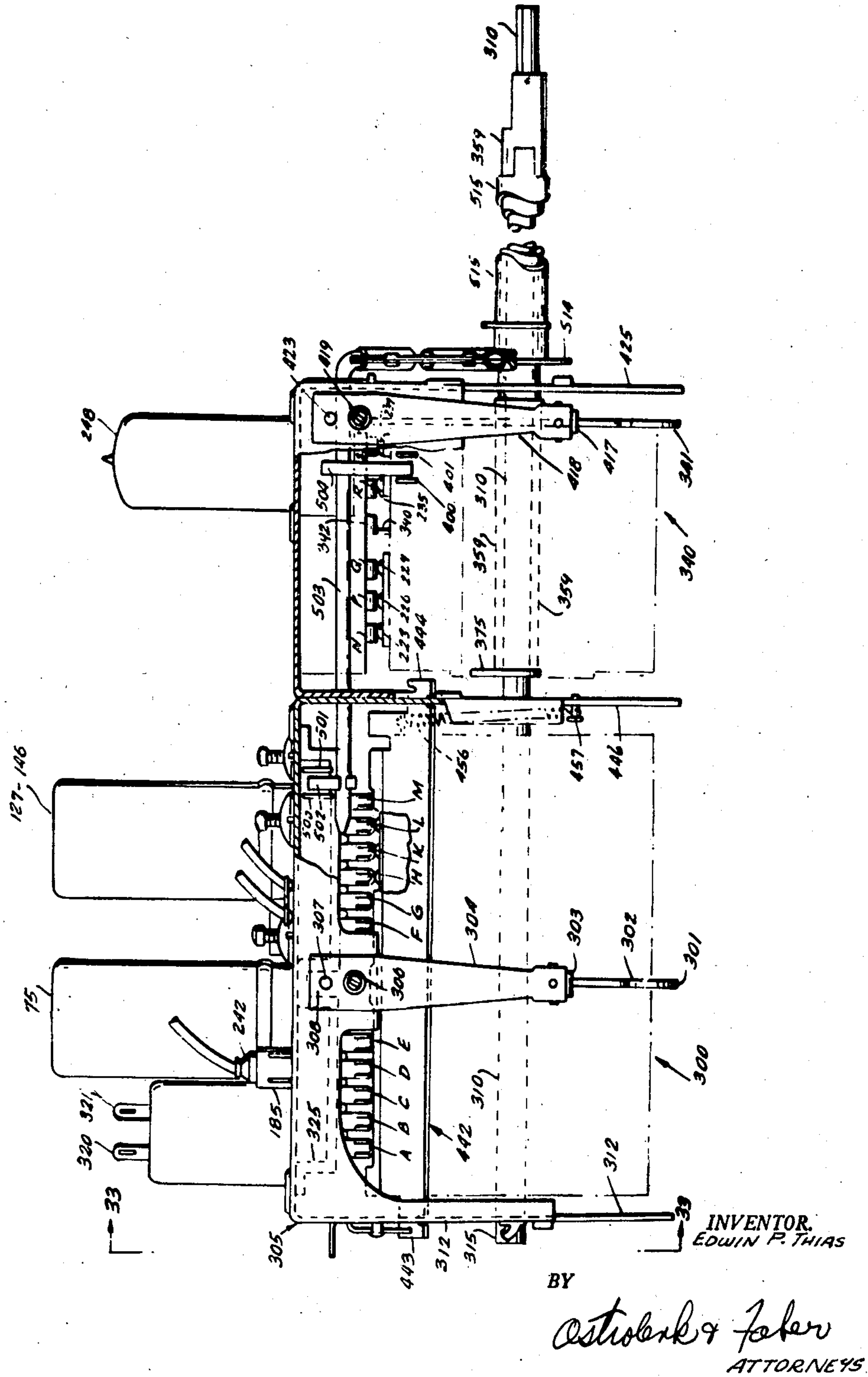

The three supporting discs for turret 300 are secured to a shaft 310 (see Figure 2*a*) extending through the whole length of the tuner and more particularly extending beyond the end wall 312 of chassis 305 in V-shaped opening 313 at its end 315. V-shaped opening 315 is engaged by a reentrant portion (not shown) of shaft 310 so that the V-shaped portion of end wall 312 acts as a bearing for shaft 310.

End wall 312 is stamped so that 2 pockets 316 and 317 are obtained on each side of opening 313. Simple wire spring 318 is used to bias shaft 310 against the V-shaped shaped opening 315 so that shaft 310 may not move away from its V-shaped bearing 315. Wire spring 318 engages at its ends the openings provided by pockets 316 and 317 and engages centrally the above mentioned end of shaft 310.

The co-axial terminal 185 is mounted on the upper surface of chassis 305 and in Figure 2 co-axial terminal 185 is shown in engagement with the co-axial cable 242.

Also mounted on the upper surface of chassis 305 is the V. H. F. input circuit described in connection with Figure 1 of which only terminals 320 and 321 are visible in Figure 2. To terminals 320 and 321 are connected during its use, the two conductors of a balanced transmission line originating from V. H. F. antenna 50 as well known in the art.

Similarly mounted on the upper surface of chassis 305 are the cascade amplifier tube 75 and the oscillator converter tube 127—146. Also visible on the upper surface 305 are trimmer capacitors described in connection with the V. H. F. section of Figure 1. Fixedly mounted on a plastic member 325 (see also Figure 5) and secured in the interior of the upper surface chassis 305 are the stationary contacts A–B–C–D–E–F–G–H–K–L–M.

The U. H. F. turret 340 is formed by a series of panels 220 supported and mounted on end discs 341 and 342. Disc 341 is provided with a number of slots 344 rectangularly shaped to be engaged by an extension 345 of panels 220. In addition to having a number of slots 344 equal to the number of panels to be mounted on supporting disc 341, disc 341 has what may be called a V. H. F. position shown in Figure 2 at the V-shaped notch 346. Slightly to one side of notch 346 is an opening 347 also in disc 341 which, as seen hereinafter, permits adjustment of the V. H. F. oscillator coils from the front end of the tuner during V. H. F. reception. End plate 341 is metallic and thus serves also as the ground plate for the adjusting screws 348 for the oscillator capacitor 232.

The U. H. F. turret 340 when mounted as shown in Figure 2 will have the opening 344 or the notch 346 of supporting disc 341 in engagement with the roller 417 mounted on a resilient finger 418. Finger 418 is rigidly secured to chassis 305 through a screw 419 and a positioning extension 423. Through the detent action provided by element 418 and roller 417 over the outer surface of disc 341, it is possible to accurately position contacts 223, 226, 229, 235, 237 and to accurately position panels 220 with respect to the stationary contacts of this U. H. F. turret.

Stationary contacts N, P, Q, R, S are mounted by means of rivets 420 to a dielectric supporting bar 421 (see Figure 5) which is in turn secured through bracket 422 to the chassis 305 of the present tuner. Mounted on the same bracket 422 and secured to it in any appropriate way is the grounding contact 392 for grounding shield 391 through its extension 390.

Secured to the front wall 425 of chassis 305 is an additional grounding contact 426 which is continuously engaged by the outwardly extending portions of conductive disc 341, thus providing a good ground for the disc 341 and, therefore, for the adjusting screws 348. Also mounted on the chassis and in position so as to be complementary and cooperating with shield 391 is a conductive shield 427 which extends transversely in chassis 305 to also divide the oscillator section of the U. H. F. tuner from the preselector section.

By the provision of shielding means 391 and 427 it is possible to reduce considerably any oscillator radiation. When the tuner is mounted, the panel mounted contacts bear against the kidney spring contacts N to S and through cooperation of roller 417 with notches 344 or 346, the rotary contacts will engage the stationary contacts N to S always at the desired preselected position so as never to change the inductance or the resistance of the path from the stationary contacts to the rotary contacts.

This is particularly important at ultra-high frequencies where any small shift of the contacts with respect to each other may produce detuning of the tuner.

Figure 8:
Figure 8 is a side view of the contacts of Figure 6 taken at line 8—8 looking in the direction of the arrows.

It was previously mentioned that the stationary contacts A to M of the V. H. F. section are mounted on a dielectric or insulating member 325 secured to chassis 305 in any suitable way, for example, through rivets. Contacts A to M, shown in detail in Figures 6, 7, 8 and 9 are made of a conductive spring material and while in one portion 428 they are completely flat, at another portion 429 they are channeled and bent at the two edges. The other end 428 terminates with an opening 430 which is engaged by the rivet 326 for mounting on supporting member 325, but the flat member 428 continues at an angle to form portion 431 which as shown in Figure 8 is provided with an opening 432 to which electrical components may be secured by soldering.

Figure 9 is a detail cross-sectional view showing how the channeling of contacts A to M is made. Separating the two sections, one having contacts A to E, the other contacts F to M, that is the R. F. section from the oscillator section, is a shield 432 which in cooperation with detent disc 301 forms a shield between the oscillator section and the antenna section to reduce to the desired level oscillator radiation.

To make detent disc 301 a better grounding plate than would be obtainable through engagement of detent disc 301 by roller 303, a grounding spring contact 434 is secured to a bent portion 435 of stationary shield 432 so that at least one of the portions of the disc 301 which extends from its average radius will engage stationary grounding contacts 434 and thus provide a better ground.

Figures 3, 4:
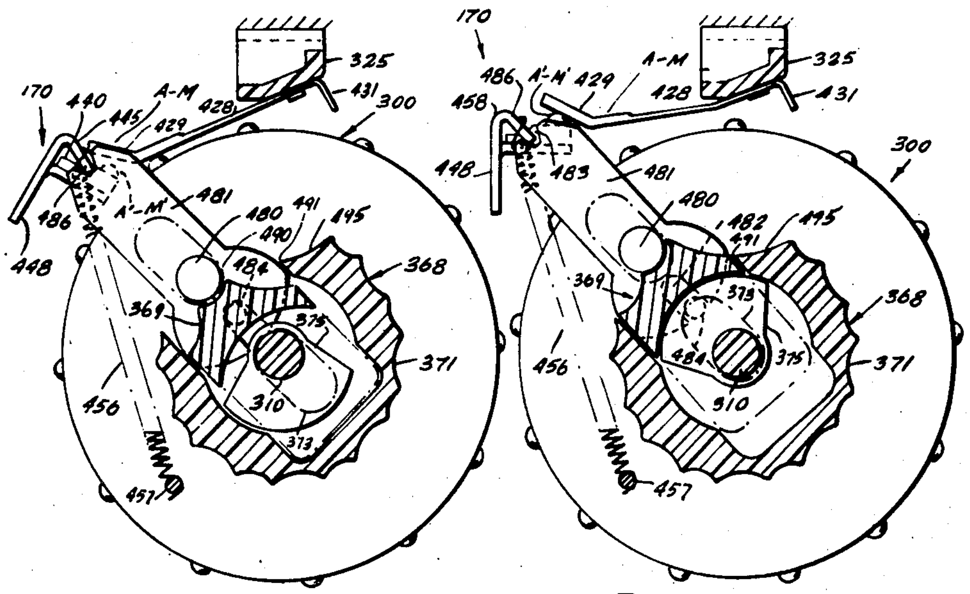

Contacts A to M may occupy two positions as can be seen in Figures 3 and 4. In Figure 3 there is shown the position for V. H. F. reception, that is, when contacts A to M engage the V. H. F. turret contacts.

Since spring contacts A to M are actually preloaded, they will engage the rotary contacts with sufficient spring bias so as to obtain electrically good contact engagement and since as shown in Figure 3 in the position shown in that figure the rotary contacts of panels 60 and 115 press on stationary contacts A to M, stationary contacts A to M are caused to deflect from the position at which they would otherwise make engagement with contacts A′ to M′ of auxiliary assembly 170 (see also Figure 1).

In other words, the rotary contacts of V. H. F. turret 300 in the V. H. F. position of the present tuner displace stationary contacts A to M so that engagement is broken between contacts A to M and contacts A′ to M′.

During U. H. F. reception, on the other hand, when as described in connection with Figure 1, auxiliary assembly 170 is used as the stationary circuit of the V. H. F. section instead of the turret mounted elements while the turret is maintained at the same position, contacts A′ to M′ are moved upwardly in Figure 4 to engage the channeled portion 429 of contacts A to M. This movement or deflection of contacts A to M caused by the motion of auxiliary assembly 170 causes the bending of contacts A to M at their flat portion 428 as clearly seen in Figure 4.

Under such conditions, contacts A to M are biased against contacts A′ to M′ very strongly, but contact is broken between contacts A to M and the rotary contacts of the V. H, F. turret 300.

As described hereinafter, this contact change is made possible in the novel manner by the cam of the present invention.

The auxiliary assembly 170, the electrical components of which were described in connection with Figure 1, consists of an insulating board 440 carrying the auxiliary contacts A′ to M′. Insulating support 440 is secured in its turn to a metallic member 442 which is provided with extensions 443, 444 of which extension 443 passes through the back wall 445 of chassis 405 and is pivoted there, while extension 444 passes through shield 446 between the V. H. F. section and the U. H. F. section and is also pivoted in an appropriate opening of shield 446.

Member 442 is angularly shaped so that while the portion 447 carries the electrical components in connection with Figure 1, the other portion 448 serves together with its extensions 443 and 444 as a means for operating auxiliary structure 170 in either one of its two positions.

Portion 448 of conductive structure 442 is provided with the recess 449 to which a grounding spring contact 450 may be secured, for example, by soldering.

Also, plastic portion 440 is provided with a recess 451 in which an insulating button 452 is mounted in any suitable way. Insulating button 452 moves together with assembly 170. At one end of portion 448 is an angular extension 454 which is provided with an opening 455 engaged by a spring 456 secured on the other side to a rivet 457 fixed on shield 446.

Assembly 170 is also biased in its V. H. F. position and actually preloaded with respect to the V. H. F. position by a wire spring 460 secured to the back wall 445 of chassis 305. More precisely, wire spring 460 engages an opening 461 in back wall 445 at one end and at its other end engages an appropriate recess 462 in extension 443 of stationary assembly support 442. Wire spring 460 also engages a rivet 464 positioned in between opening 461 and extension 443 so that wire spring 460, considered originally straight, will have to bend in order to engage opening 462 of extension 443 and, therefore, will maintain auxiliary assembly 170 biased in one direction.

Figure 5:
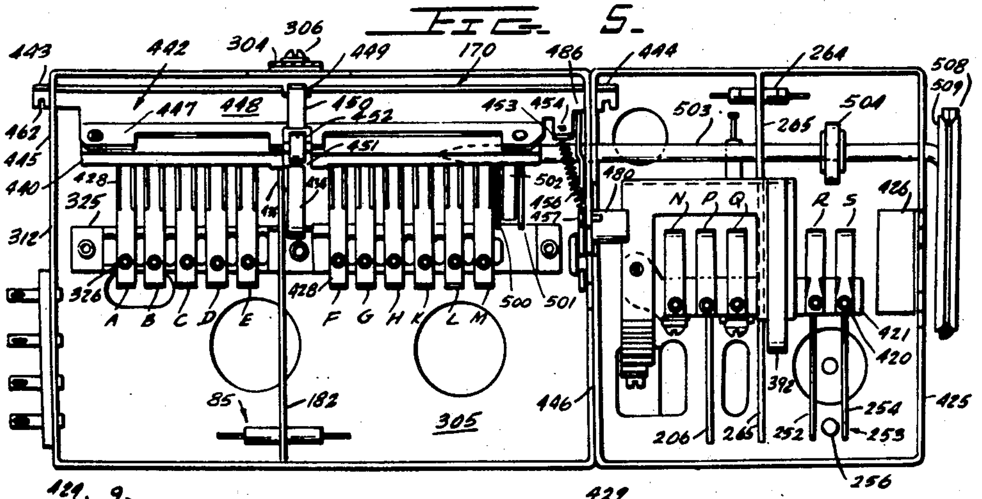
Figure 6:
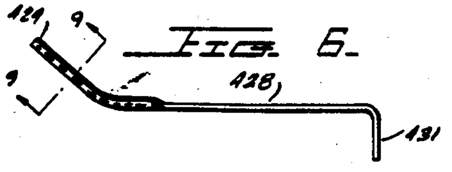

Referring now to Figure 5, when V. H. F. turret 300 is properly mounted in chassis 305 and assembly 170 is set in its inoperative or V. H. F position (see Figure 3), then in any position of the V. H. F. turret, one notch 302 of position disc 301 will engage the insulating roller 452 due to the fact that roller 452 is mounted on the insulating base 440 and therefore moves together with assembly 170 from the position shown in Figure 4 to the position shown in Figure 3 as the operator moves appropriate dials from U. H. F. to V. H. F. reception.

It will be seen, referring to Figures 9*a* and 9*b*, that every time the V. H. F. turret is moved by one channel, through action of disc 301, roller 452 is caused to move in a direction against that of springs 456 and 460. In other words, the whole assembly 170 will press down on contacts A to M at each rotation of turret 300, thus producing at each rotation a wiping and cleaning action on contacts A to M.

As seen hereinafter, a similar wiping or cleaning action is performed also during U. H. F. operation by the U. H. F. turret.

It was previously mentioned that disc 342 of U. H. F. turret 340 has at one end a cam surface 368. Cam surface 368 is engaged by a roller 480 (see Figures 3 and 4) which is biased against cam surface 368 by the action of spring 456 operating on sliding member 481. Sliding member 481 to which pin 480 is secured in any suitable way, for example by means of a rivet, is fork-shaped at its ends 482 and 483, of which the fork at 482 engages a positioning pin 484 which may be a rivet secured to the center shield 446.

The two forks at 482 and 483 are so shaped that while fork 482 permits member 481 to move only in its axial direction fork 483 serves to translate the longitudinal notch of member 481 into an angular motion of extension 486 and therefore auxiliary assembly 170.

This is seen in Figures 3 and 4. Figure 4 shows slidable member 481 in what we may call, with reference to Figure 4, its highest position, which as clearly shown there means that assembly 170 would be at one of its angular limits pressing on the contacts A to M against their biasing action. In Figure 3, on the other hand, slidable member 481 is shown in its lowest position or its V. H. F. position so that auxiliary assembly 170 occupies now the other limiting angular position. In this position, because of the presence of the V. H. F. turret 300, contacts A to M do not bear against contacts A′ to M′ of auxiliary assembly 170, but they bear against the contacts of the V. H. F. panels 60 and 115. This slidable movement is imparted to member 481 by the cam surface 368 acting on pin 480 at rotation of U. H. F. turret 340.

As can be seen from Figure 4, when a notch such as 371 engages pin 480, then slidable member 481 will be in its upper position, the upper position being the same regardless of which of the notches 371 is engaging pin 480. In one position, however, of U. H. F. turret 340, pin 480 will be engaged by member 369 or, better, notch 490 of member 369 will engage the pin 480 and be pushed down by pin 480 if the V. H. F. controlled sector 375 is not positioned directly against the shoulder 374 of member 369 as, for example, shown in Figure 4.

Figure 3 then shows the relative position of the cam mechanisms when sector 375 allows free longitudinal movement of member 369 in an appropriate groove 491 in the rear plate 342. This then corresponds to the V. H. F. position of the cam system.

It is possible now to describe the operation of the present tuner, especially when channels 11, 12 and 13 are desired. Starting from V. H. F. reception, the U. H. F. turret is first rotated until pin 480 engages notch 495. Now the distance from the bottom of notch 495 to the center of shaft 305 is less than the distance from the bottom of notches 371 to the same center of shaft 305 and therefore when pin 480 is engaged by notch 495, slidable member 481 would also be at its lowest position.

This may be seen in Figure 10. When the cam mechanism is in this position, contacts A to M engage the rotary contacts of V. H. F. turret 300 while contacts A' to M' would be disconnected. If now shaft 305 is rotated, it will be positioned to receive all the twelve V. H. F. channels corresponding to the twelve panels mounted on the V. H. F. turret 300.

It is to be understood that while a system with 12 V. H. F. channels is here described, this invention is applicable to systems using a different number of V. H. F. channels.

If, on the other hand, a U. H. F. channel is desired, U. H. F. turret 340 is rotated through its shaft 359 until the correct notch 371 engages pin 480. Under such conditions, assembly 170 is rotated counterclockwise with respect to the position shown in Figure 10 so that it takes a new position as shown in Figure 11.

In Figure 11, contacts A to M are removed from engagement with the contacts of the V. H. F. turret 300 and now engage contacts A' to M' of auxiliary assembly 170 to thus change the V. H. F. section into an I. F. amplifier as described in connection with Figure 1.

After rotation of the U. H. F. turret for the selection of the desired U. H. F. band, V. H. F. shaft 305 is now operated so that at its rotation, plates 267, 268 and 269 are moved with respect to U. H. F. turret mounted capacitor plates 221, 225, 228, 233 and 236.

The dielectric plates 267, 268 and 269 and plates 221, 225, 228, 233 and 236 are so shaped that any of the U. H. F. bands, an equal angular rotation of plates 267, 268 and 269 causes the selection of a U. H. F. channel. To give a specific example, plates 221, 225, 228, 233 and 236 of the U. H. F. panel corresponding to U. H. F. channels 30 to 39 are so shaped that at each position of the V. H. F. positioning disc 301, capacitors 222, 231 and 232 have the value or capacitance which would produce the selection of the desired U. H. F. channel located in the band between channels 30 and 39.

Since the V. H. F. detent disc 301 serves to position all the U. H. F. channels after the selection of the band by rotation of turret 340, equal rotation of dielectric plates 267, 268 and 269 rotatable with V. H. F. turret 300 must produce the tuning through an equal movement of channels in the U. H. F. region regardless of which U. H. F. panel 220 is made operative. This is achieved in the present invention essentially in the manner described in the copending application, Serial No. 325,514, filed December 12, 1952, by varying the shape of the conductive plates 221, 225, 228, 233 and 236 for each of the U. H. F. panels.

An important aspect of the present invention is that there are actually two different ways of obtaining channels 10, 11, 12 and 13 in the V. H. F. region. One method was mentioned in connection with the V. H. F. reception. Another consists of positioning the U. H. F. turret for reception of signals from channels numbered 10 to 19. In other words, U. H. F. turret 340 is first positioned so that the first panel in the present invention engages the stationary contacts N, P, Q, R, S.

Figure 4 shows the relative positions of the cam mechanisms when the U. H. F. channels 14 to 19 are being selected by the present tuner. As can be seen from Figure 4, member 369 is here caused to move to its upper position and carry with it pin 480 by circular sector 375 bearing against shoulder 374 of member 369. Sector 375 will rotate as the operator moves the V. H. F. shaft and therefore the dielectric plates 267, 269 and 268 for reception of U. H. F. channels 14 to 19.

But the motion of sector 375 is such that member 369 and therefore slidable member 481 through engagement with pin 480 remains in its upper position which corresponds, as previously mentioned, to U. H. F. reception.

When the operator now goes from channel 14 to 13, which as is well known, is the highest V. H. F. channel but is separated from the lowest U. H. F. channel by more than 200 megacycles, sector 375 permits member 369 to move downwardly as shown in Figure 3 so that contacts A to M now engage the contacts of panels 60 and 115 of the V. H. F. turret 300.

When the other channels 12, 11 and 10 are desired, sector 375 is of course rotated but its rotation no longer affects the position of member 369 and therefore of slidable member 481 until passing for example through channel 10, the operator returns to channel 19. In that case, sector 375 will push the slidable member 481 again in its upper position shown in Figure 4 and U. H. F. reception will be obtained.

To summarize the above, the cam of the present invention makes possible the reception of channels 10 to 13 even when the first panel of the U. H. F. turret is in its operative position so that no discontinuity is encountered as the operator goes from selection of channel 13 in the V. H. F. band to channel 14 in the U. H. F. band for which, as described in connection with Figure 1, quite different circuits are used.

In the foregoing the invention has been described solely in connection with specific illustrative embodiments thereof. Since many variations and modifications will now be obvious to those skilled in the art, it is preferred to be bound not by the specific disclosures herein contained but only by the appended claims.

I claim:

1. A turret television tuner having an oscillator section and a signal frequency tuning section, a plurality of removable panels for each of said sections, a positioning disc, said removable panels being rigidly supported on said positioning disc, a roller cooperating with said positioning disc for bringing said turret to predetermined angular stop positions, a metallic spring member cooperating with said positioning disc and connected to ground, and a second roller, a plurality of cooperating contacts, said second roller being operable by said positioning disc for effecting wiping action of said contacts.

2. A turret television tuner having an oscillator section and a signal frequency tuning section, a plurality of removable panels for each of said sections, a positioning disc, said removable panels being rigidly supported on said positioning disc, a roller cooperating with said positioning disc for bringing said turret to predetermined angular stop positions, a metallic spring member cooperating with said positioning disc and connected to ground, and a second roller, a plurality of cooperating contacts, said second roller being operable by said positioning disc for effecting wiping action of said contacts, said positioning disc being interposed between said oscillator and tuning sections, and a construction cooperating with said positioning disc for electrically shielding said oscillator from said tuning section.

References Cited in the file of this patent

UNITED STATES PATENTS

| | | |
|---|---|---|
| 2,496,183 | Thias et al. | Jan. 31, 1950 |
| 2,545,681 | Zepp et al. | Mar. 20, 1951 |
| 2,611,807 | Lazzery | Sept. 23, 1952 |
| 2,657,365 | Lazzery | Oct. 27, 1953 |
| 2,755,386 | Thias | July 17, 1956 |

FOREIGN PATENTS

| | | |
|---|---|---|
| 168,350 | Great Britain | Sept. 8, 1921 |
| 413,251 | Germany | Jan. 22, 1924 |